(12) United States Patent
Pchelnikov et al.

(10) Patent No.: US 6,522,222 B1
(45) Date of Patent: Feb. 18, 2003

(54) ELECTROMAGNETIC DELAY LINE WITH IMPROVED IMPEDANCE CONDUCTOR CONFIGURATION

(76) Inventors: Yuriy Nikitich Pchelnikov, 104 Drexelbrook Ct., Apex, NC (US) 27502; David Scott Nyce, 2633 Whistling Quail Run, Apex, NC (US) 27502

( * ) Notice: Subject to any disclaimer, the term of this patent is extended or adjusted under 35 U.S.C. 154(b) by 25 days.

(21) Appl. No.: 09/888,690

(22) Filed: Jun. 26, 2001

(51) Int. Cl.[7] ................................................. H01P 5/18
(52) U.S. Cl. ..................................... 333/161; 333/156
(58) Field of Search ............................... 333/161, 140, 333/156; 336/232

(56) References Cited

U.S. PATENT DOCUMENTS

| | | | |
|---|---|---|---|
| 3,736,534 A | * 5/1973 | Chaffee | 333/31 R |
| 5,187,455 A | * 2/1993 | Mandai et al. | 333/161 |
| 5,365,203 A | * 11/1994 | Nakamura et al. | 333/161 |
| 5,923,230 A | * 7/1999 | Yoshida et al. | 333/161 |

* cited by examiner

*Primary Examiner*—Michael Tokar
*Assistant Examiner*—Vibol Tan

(57) ABSTRACT

An improved delay line with an input and an output is disclosed wherein a signal passing through the delay line from the input to the output can be optimized regarding the delay line component size, delay time, and signal configuration. The design and use of more than one impedance conductor is taught. The impedance conductors are arranged in specific alignments with each other and with dielectric bases to result in reduced component size, increased delay time, and to adjust the signal configuration. Further optimization of these features is taught through the use of a shield cover in specific alignment to the impedance conductors and dielectric bases.

20 Claims, 8 Drawing Sheets

ELECTROMAGNETIC DELAY LINE WITH IMPROVED IMPEDANCE CONDUCTOR CONFIGURATION

BACKGROUND OF THE INVENTION

1. Field of the Invention

The present invention relates to the field of apparatus and devices for the delay of electromagnetic signals. More particularly, the present invention relates to electromagnetic delay lines typically formed as printed circuits. It also relates to distributed delay lines for handling high speed signals, such as those having a rise time equal to or less than one nanosecond.

2. Description of the Prior Art

Prior art recognizes the usefulness of applying RF delay lines in radio-electronics and high speed computers to align the relative timing of electronic pulses. Delay lines with an anomalous characteristic, in which the delay time decreases with increasing frequency, also are used for sharpening (compressing) radio frequency pulses.

A simple method used to implement a delay line is to insert a length of standard 50 ohm transmission cable in series with the line carrying the signal to be delayed. This works well, but takes up a large amount of space. As commercially available components, radio frequency delay lines are typically implemented as coils connected in series or by microstrip deposition on a printed circuit board, see E. F. Bayev and E. I. Burylin, "*Miniature Electrical Delay Lines*", Sov. Radio: Moscow, 1977 (in Russian).

Reductions in physical size have allowed the manufacture of standard delay line components which can be inserted into a printed circuit board. Using a two-conductor transmission line in which one conductor has a pattern, as the spiral pattern of FIG. 1 or the meander line of FIG. 2, and the other conductor is a ground plate, increases the delay time in such devices. The patterned conductors (spiral, meander, zigzag, or other pattern) are called impedance conductors. Selecting a high permittivity (or dielectric constant) material to be adjacent to the impedance conductor further increases the delay time. In order to provide a delay time exceeding one nanosecond, while retaining relatively small dimensions for the delay line, the relative permittivity of the high permittivity material (e.g.: the circuit board) should be as high as 60–100.

In addition (or alternatively) to increasing the transmission line length or adding an adjacent high permittivity material to increase delay time, the delay time also can be increased by using a high permeability material for the conductors which form the delay line, see U.S. Pat. No. 6,154,104 "*High permeability tapped transmission line*", Hall; Garrett W. The high permeability and high permittivity materials, as taught in Hall, serve to allow an increase in delay time for a given size. This differs from the present invention, however, in that specific physical arrangements among impedance conductors to achieve another method for increased delay time are taught in the present invention.

In the prior art, delay time $t_d$ is a function of the path s along the conducting elements forming the pattern, the relative permittivity $\epsilon_r$ of the adjacent material between the conductors, and the relative permeability $\mu_r$ of the outside impedance conductor. Approximately, this relationship follows the general formula:

$$t_d = \frac{s\sqrt{\epsilon_r\mu_r}}{3 \cdot 10^8} \text{ sec.} \tag{a}$$

Conventionally, the pattern formed by the impedance conductor of a delay line can be described as a row of conducting members connected in series and spaced with pitch h in the direction of signal propagation, said conducting members being inclined with respect to the direction of signal propagation. The direction of signal propagation can be radial or longitudinal. The pattern can be characterized by width H or perimeter p equal to $2\pi r$ for a regular flat spiral (where r is the radius of the spiral), and by period T or pitch h. In a meander line, the period T is equal to 2 h.

According to the definitions mentioned above, formula (a) can be rewritten for a homogeneous delay line as:

$$t_d = \frac{N_0\sqrt{\epsilon_r\mu_r}}{3 \cdot 10^8} l \text{ sec.,} \tag{b}$$

where l is the delay line's length, and $N_0$ is the geometric deceleration defined for a meander line as (H+h)/h.

In an inhomogeneous delay line, such as a flat spiral, the delay time can be calculated by the formula:

$$t_d = \frac{1}{3 \cdot 10^8} \sum_{1}^{n} p_i \text{ sec.,} \quad i = 1, 2, 3, \ldots \tag{c}$$

where $p_i$ is the perimeter (length) of the winding, and n is the number of windings For a regular radial spiral, the relationship is:

$$t_d = \int_{r_1}^{r_2} \frac{2\pi r\sqrt{\epsilon_r\mu_r}}{3 \cdot 10^8 h} dr \text{ sec.} \tag{d}$$

where $r_1$ is the minimum, and $r_2$ is the maximum radius.

However, when a delay line is constructed with high permeability or high permittivity materials for the base element and layers adjacent to the impedance conductor, additional electromagnetic signal dissipation is caused by the losses in the base and layers. For delay times exceeding 10 nanoseconds, these losses are very large. Frequency dependence (shape) of the attenuation factor also changes the configuration (shape) of the signal. Temperature dependence of permittivity and permeability of these materials is large, which leads to variation in the delay time with changes in temperature. Also, high permittivity and high permeability materials are expensive.

To achieve a delay time exceeding 10 nanoseconds while preserving the signal amplitude and configuration, additional deceleration of the signal should be obtained without increasing the conductor length, the permittivity, or the permeability of the materials. Thus, there is a need in the art for a new way to design delay lines with small dimensions, small electromagnetic losses, and high delay time.

In U.S. Pat. No. 4,570,136, "Electromagnetic Delay Line", Kameya, Kazuo, a microstrip delay line with electromagnetic coupling between the individual conducting elements of the same electrodynamic structure is shown. This differs from the present invention in that Kameya teaches an increase in delay time which is caused by the displacement of the conducting elements in the transverse direction. This adds to complexity of construction, and the increase in delay time is not significant when compared to the greater increase in delay time which is achieved by using the present invention. The present invention teaches a greater increase in delay time without an increase in complexity of construction.

SUMMARY OF THE INVENTION

In contrast to prior art delay line components, the present invention provides a novel method for increasing the delay time, reducing the physical size, or adjusting the signal configuration. In addition to the prior art methods of path length, permeability of the impedance conductors, and permittivity of the adjacent material, the present invention teaches constructions which accomplish this through interaction of electromagnetic fields.

Both the prior art and the present invention provide for the delay of an electromagnetic signal. The present invention and some of the prior delay lines use a dielectric base, such as a printed or multi-layer circuit board, and at least two conductors forming a transmission line.

It is an object of the present invention to create a distributed delay line, which provides a delay time exceeding the delay time defined by geometric deceleration and materials of construction, including materials of high permeability and high permittivity.

It is a further object of the present invention to provide a distributed delay line, which is easy to manufacture and is economical.

It is a further object of the present invention to provide a distributed delay line, having a delay time which has reduced temperature sensitivity.

It is a further object of the present invention to provide a simple distributed delay line, with an anomalous dependence of the delay time upon frequency.

It is a further object of the present invention to provide a distributed delay line which has small electromagnetic losses.

It is yet a further object of the present invention to provide a distributed delay line which can be used to control the configuration of an output signal.

According to the most general aspects of the present invention, these objectives are accomplished by distributed delay lines comprising at least one non-conducting base and at least two conductors which face one another, thus forming a transmission line with at least two input terminals and at least two output terminals. The signal is delayed between the input terminals and the output terminals of the delay line. The delay time is greater than the delay time achieved in prior art. This is accomplished by forming at least two of the adjacent conductors as rows of conducting members arranged in series with pitch h. The pitch is in the direction of signal propagation. The adjacent conductors are connected to one another with spacing. The conducting members are inclined to the direction of the signal propagation, with conducting members of different impedance conductors facing one another being inclined in opposite directions (e.g. clockwise and counterclockwise).

BRIEF DESCRIPTION OF THE DRAWINGS

For a further understanding of the present invention and the features and advantages thereof, reference is now made to the Detailed Description in conjunction with the attached drawings, wherein.

DETAILED DESCRIPTION OF THE INVENTION

The present invention employs coupled impedance conductors to implement novel delay line devices, providing a time delay of electromagnetic signals. This technology enables the design of time delay components with one or more improvements over prior art, including increased time delay, decreased attenuation, electromagnetic signal processing (such as signal compression), reduction of size and cost, and simplified manufacturing.

Figure 3:
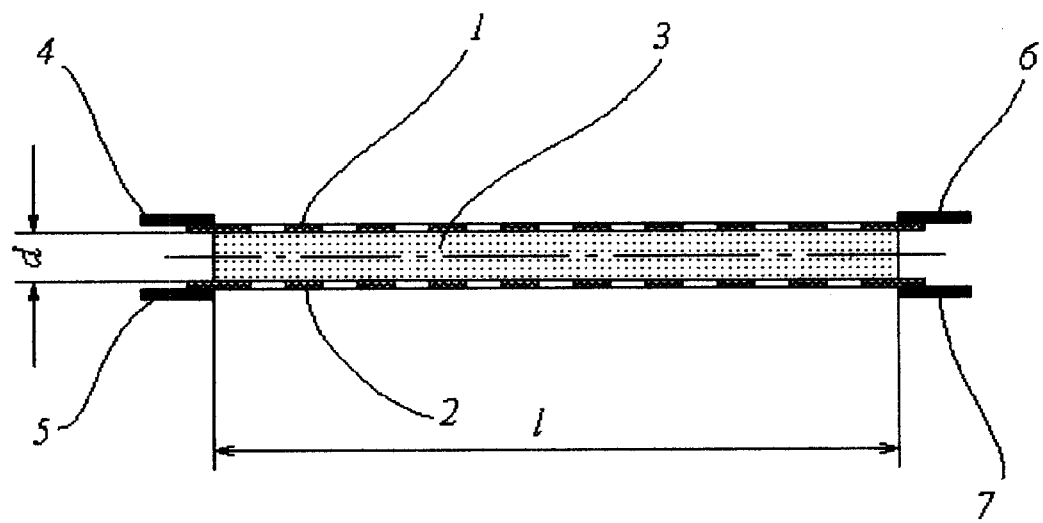
FIG. 3 shows a sectional view of a delay line according to the present invention with two impedance conductors.

FIG. 3 is a sectional view of an electromagnetic delay line according to this invention. Impedance conductors 1 and 2 are facing each other through dielectric base 3, the dielectric base having thickness d and relative permittivity $\epsilon_r$. The width of conductors 1, 2 and base 3 are designated as H (refer to FIG. 8). The impedance conductors are connected at one end to terminals 4 and 5 forming the input of the delay line, and are connected at the opposite end to terminals 6 and 7, forming the output of the delay line.

Figure 4:
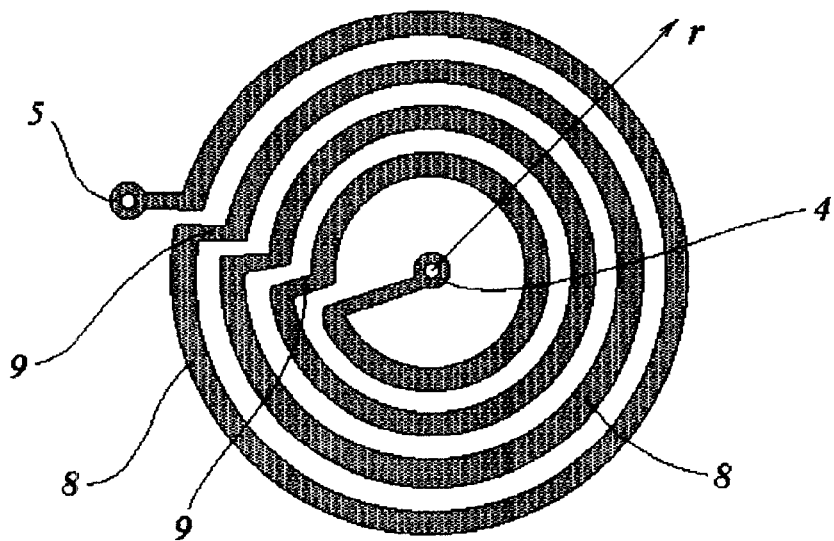
FIG. 4 shows an example of a pattern formed by conducting members, (8), and conducting elements, (9).

FIG. 4 shows an example of an impedance conductor pattern formed by conducting members 8 arranged in series in the signal propagation direction r, and connected to one another by conducting elements 9.

Figure 5:
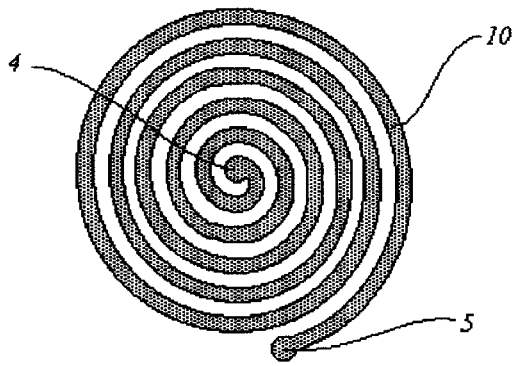
FIG. 5 shows an example of a regular radial spiral pattern.

The pattern in FIG. 4 can be transferred to a regular flat spiral by arranging the conducting members 8 and conducting elements 9 in one line, forming windings 10 (FIG. 5).

Figure 2:
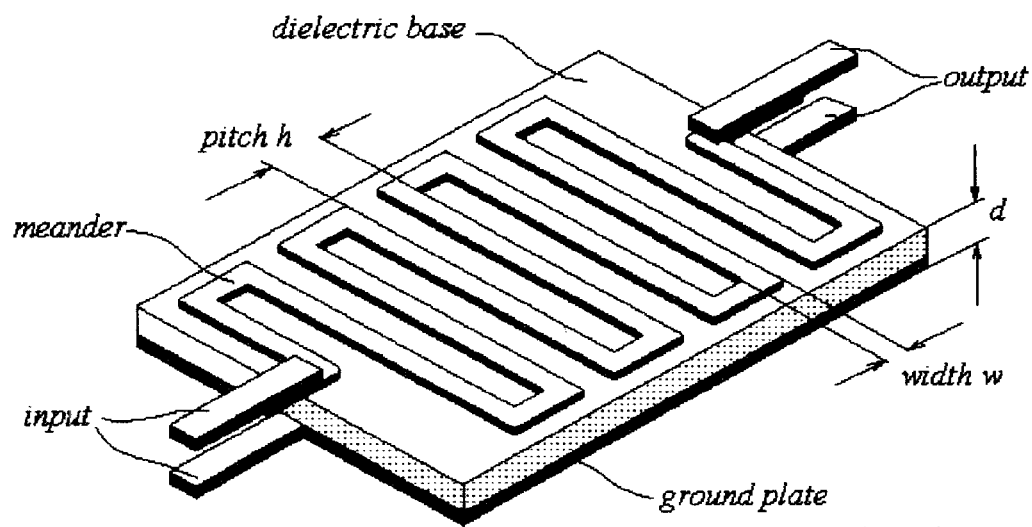
FIG. 2 is a meander line type of delay line of the prior art applied to the surface of a high permittivity dielectric base. Formula (b) describes the amount of time delay obtained with this configuration.

Commonly, an impedance conductor, such as the meander line shown in FIG. 2, differs from a solid conductor, such as the ground plate in FIG. 2, by its increased specific inductance $L_0$, while specific capacitance $C_0$ approximately equals the static capacitance between solid conductors with the same surface area. This leads to an electromagnetic wave delay, characterized by a deceleration factor N and defined by the formula $$N = \sqrt{\frac{C_0 L_0}{\varepsilon_0 \mu_0}}, \quad (e)$$

where $\varepsilon_0$ and $\mu_0$ are the permittivity and permeability of vacuum, respectively.

When the distance, d, between conductors is relatively small, the specific capacitance can be defined by:

$$C_0 = \varepsilon_0 \varepsilon_r \frac{wH}{hd}, \quad (f)$$

where w is the width of the traces forming the pattern of the impedance conductors.

Contrary to a single solid conductor which has a theoretical infinite inductance, the specific inductance of one impedance conductor is finite and can be calculated by the following approximate formula from electrodynamic theory: (see Yu. N. Pchel'nikov "On the Replacement of Slow-Wave Systems by a Three-Conductor Equivalent Line", *Journal of Communications Technology and Electronics, Vol.* 39, #9, pp. 68–74)

$$L_0 \approx \mu_0 \mu_r \frac{H\lambda}{2\pi N wh}, \quad (g)$$

where $\lambda$ is the wavelength in free space, and $\mu_r$ is the relative permeability of the medium surrounding the impedance conductor.

When a flat impedance conductor is placed face to face near a solid conductor (shown in FIG. 2 as the meander line and the ground plate), an electromagnetic wave is excited between the conductors. The specific inductance $L_0$ decreases due to the opposite direction of the current excited on the surface of the solid conductor. If the distance d between said conductors is relatively small, $$L_0 \approx \mu_0 \mu_r \frac{Hd}{wh}. \quad (h)$$

It follows from formulas (e), (f), and (h) that when a flat impedance conductor is placed face to face near a solid conductor as in prior art, deceleration N' is defined by:

$$N' \approx \frac{H\sqrt{\varepsilon_r \mu_r}}{h} \quad (i)$$

Formula (i) enables obtaining formula (b) for the delay time in a homogeneous delay line.

Figure 6:
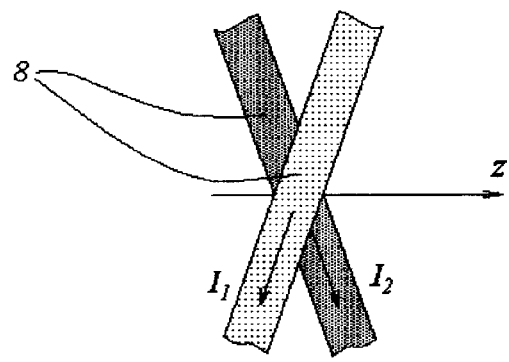
FIG. 6 shows the direction of currents in conductive members facing one another.

Although prior art addresses the use of one impedance conductor and a ground plate, the present invention teaches the use of two impedance conductors. When two impedance conductors face one another according to the present invention, and an anti-phase type of wave is excited between the impedance conductors, the magnetic fields of the conductors will add to one another if transverse currents $I_1$ and $I_2$ have the same direction as each other (clockwise or counterclockwise), as shown in FIG. 6. This is possible for patterns with opposite symmetry, such as counter wound spirals (FIG. 7) or meanders placed in parallel and shifted with respect to each other by pitch h (FIG. 8).

Figure 7:
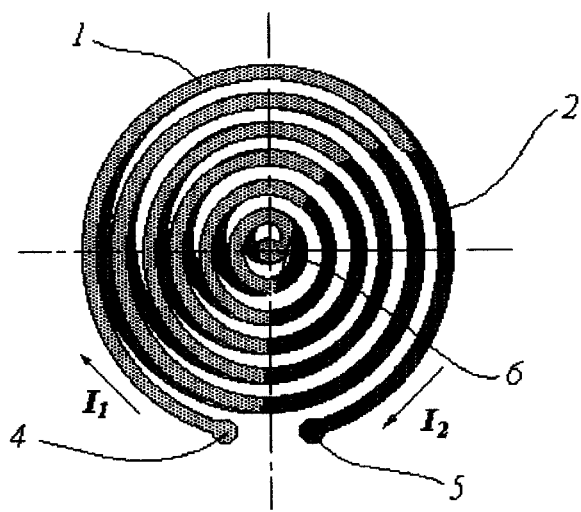
FIG. 7 shows radial spirals having patterns which are mirror images, one being flipped 180° with respect to the other.
Figure 8:
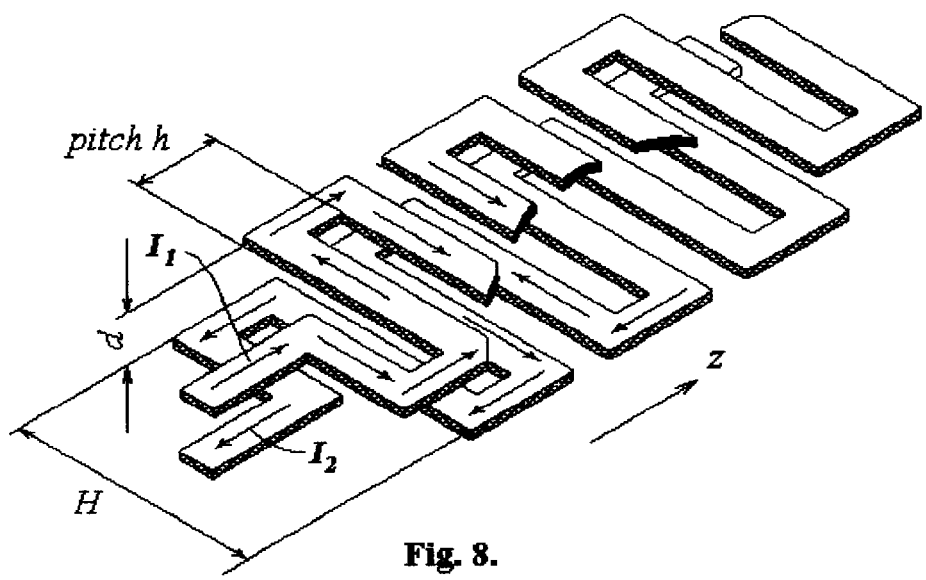
FIG. 8 shows meanders with one shifted relative to the other in the longitudinal direction at pitch h.

When the configuration of impedance conductors 1 and 2 are mirror images, e.g. the counter wound spirals shown in FIG. 7, the inductance of each impedance conductor increases by the same amount due to the additional magnetic flux excited by the current in the other conductor. If distance d between conductors 1 and 2 is relatively small, the increase in inductance equals 2. Adding the inductances together results in a fourfold increase in $L_0$, compared to the inductance of one conductor defined by formula (g), while specific capacitance $C_0$ will stay the same, as defined by formula (f)

$$L_0 \approx \mu_0 \mu_r \frac{2H\lambda}{\pi Nwh}. \quad (j)$$

Replacing $L_0$ and $C_0$ in formula (e) by their expressions from (f) and (j), the following formula can be derived for coupled impedance conductors $$N'' \approx \sqrt[3]{\varepsilon_r \mu_r \frac{H^2 \lambda}{h^2 \pi d}}. \quad (k)$$

Figure 1:
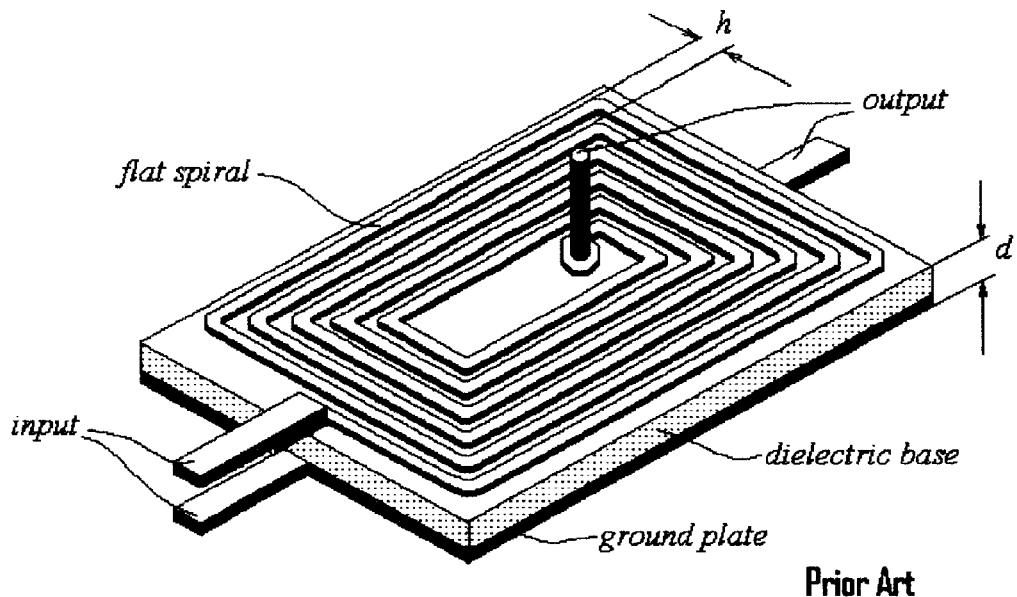
FIG. 1 is a spiral pattern delay line of prior art applied to the surface of a high permittivity dielectric base. The formula (c) describes the amount of time delay obtained with this configuration.

Comparison of formulas (i) and (k) shows that the deceleration of a monochromatic wave in coupled impedance conductors exceeds the deceleration in delay lines of prior art, e.g. a delay line based on a radial spiral with a solid conductor shown in FIG. 1. Dividing the right side of formula (k) by right side of formula (i) results in:

$$\frac{N''}{N'} \approx \sqrt[3]{\frac{\lambda}{n_0 \pi d}}. \quad (l)$$

For $n_0$=10, d=$10^{-4}$ M, and $\lambda$=0.314 M; the relation N"/N'= 3.16.

The anomalous frequency dependence exhibited in formula (k) can be used for pulse compression.

In an impedance conductor having current opposite to the direction of current in adjacent conducting members 8, e.g. in a meander, specific inductance $L_0$ is defined by: (see Yu. N. Pchelnikov): "Meander-Lines Analysis at Low Frequency", Engineering Electrodynamics, Saratov Politechnic Institute, 1982, pp. 3–12 (in Russian).

$$L_0 \approx \mu_0 \ \mu_r \ H/w2\pi. \quad (m)$$

Substituting in equation (e) $4L_0$ from (m) and $C_0$ from (f), one can obtain $$N'' = \frac{H}{h}\sqrt{\varepsilon_r \mu_r \frac{2h}{d}}. \quad (n)$$

It is seen from the equation above that when h/d is equal to 5, the result is an approximately threefold increase in deceleration, N". Formula (n) demonstrates an absence of frequency dependence. This preserves the signal configuration.

It follows from the analysis shown above, that the increase in time delay due to the increase in deceleration is achieved because of the increase in specific inductance, $L_0$, compared to the prior art. This increase in time delay does not require the use of high permittivity materials, making the delay line economical to manufacture. The use of low permittivity materials which are stable with temperature changes increases the stability of delay lines manufactured according to the present invention.

Figure 9:
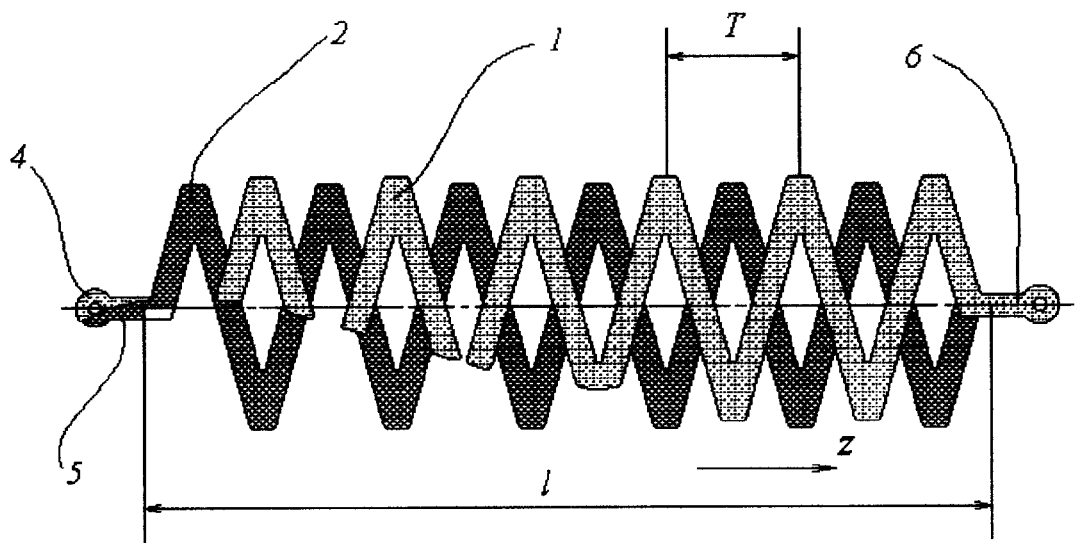
FIG. 9 shows an example of impedance conductors configured as zigzags.

The anomalous time dependence (delay time increases when the frequency decreases, i.e. the wavelength $\lambda$ increases) is achieved due to the increase in specific inductance, $L_0$, as the wavelength $\lambda$ increases (see formula (k)). Electromagnetic losses are reduced because of the relatively short signal path. The increased delay is achieved without increasing this path length. The simplicity and economy of delay lines constructed according to this invention are achieved because standard PCB technology can be used. The increase in delay time, signal compression, or preserving signal configuration can be achieved by using coupled meanders (FIG. 8) or coupled zigzags (FIG. 9). The additional delay time can be obtained independently of frequency.

Figure 10:
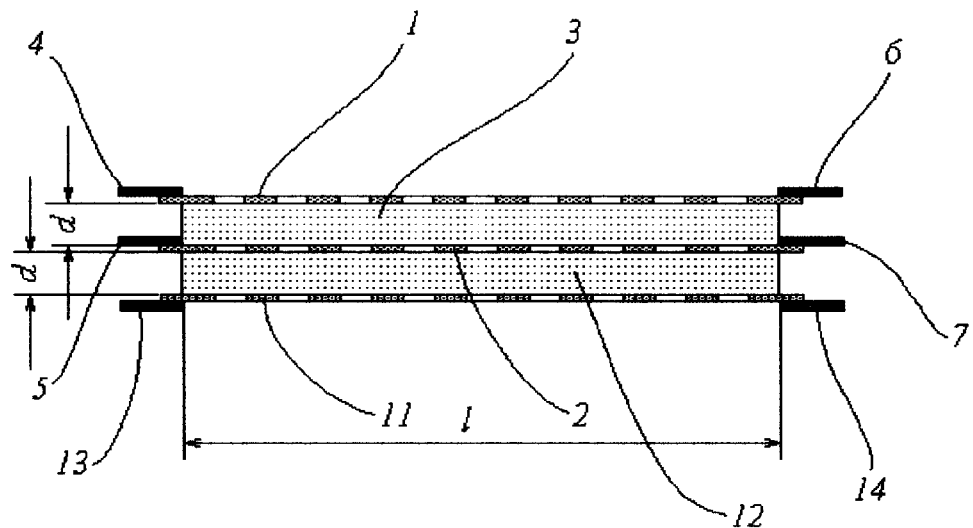
FIG. 10 shows a sectional view of the delay line according to the present invention with three impedance conductors.
Figure 11:
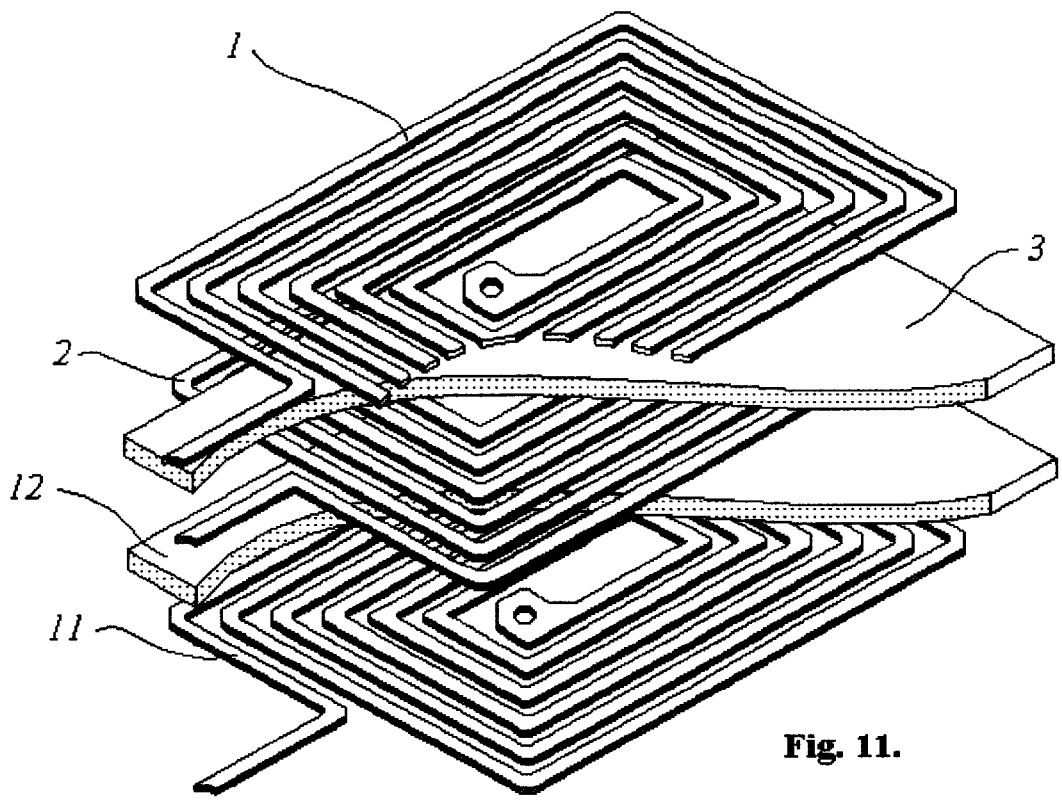
FIG. 11 shows an example of impedance conductors forming a three conductor electromagnetic delay line, according to the present invention.

Adding a third impedance conductor 11 shown in FIG. 10 can increase the delay time at least by a factor of $\sqrt{2}$. An additional non-conducting base, 12, is placed between impedance conductors 2 and 11. Conducting members 8 of impedance conductors 1 and 11 are declined in the same direction. The best results are obtained when outer conductors 1 and 11 have the same orientation as each other and the middle conductor 2 has the configuration of a (flipped by 180°) mirror image of conductors 1 and 11. The parallel flat spirals can be positioned as shown in FIG. 11. The best results can be achieved if impedance conductors 1 and 11 are connected to identical terminals.

If the distance between impedance conductor 2 and impedance conductors 1 and 11 is identical and is the same as when using two impedance conductors, the specific inductance does not change and is defined by formula (j), while specific capacitance $C_0$ doubles due to doubling of the area of facing one another. This results in the deceleration increasing by $\sqrt{2}$ times.

Constant pitch h along the delay line (in the signal propagation direction) of the pattern of the conducting members, along with constant width w of the conducting members, and constant width H of the pattern produces constant deceleration along the delay line and constant wave impedance. A decrease in width w results in an identical increase in specific inductance $L_0$ and a decrease in specific capacitance $C_0$. This causes an identical increase in the wave impedance $Z_0$, while deceleration N does not change. Changing pitch h or width H, or both, changes deceleration N or wave impedance $Z_0$, or both.

To maintain constant deceleration N and constant wave impedance Z, distance d between impedance conductors 1, 2, and 11 should be constant. An increase in the distance d causes a decrease in deceleration N, and an increase in the wave impedance Z. This can be used to allow loading the delay line according to the present invention with an impedance higher or lower than the electromagnetic signal source impedance.

A preferred embodiment of an electromagnetic delay line according to the present invention is shown in FIG. 8 and represents at least two meander-lines facing one another, with one shifted in the longitudinal direction (in the coordinate z direction) with respect to the other, by a distance equal to the pitch, h.

A preferred embodiment of an electromagnetic delay line without a non-conducting base, and according to the present invention, is shown in FIG. 9. Here, the conducting members, 8, of each impedance conductor change their direction from clockwise to counter clockwise periodically, with period T, from one conducting member to the other. This zigzag configuration allows connecting the ends of the impedance conductors without need for conducting elements, 9. The facing conducting members, 8, as part of the impedance conductors 1, 2, are inclined in the direction opposite to the direction z of signal propagation.

Figure 12:
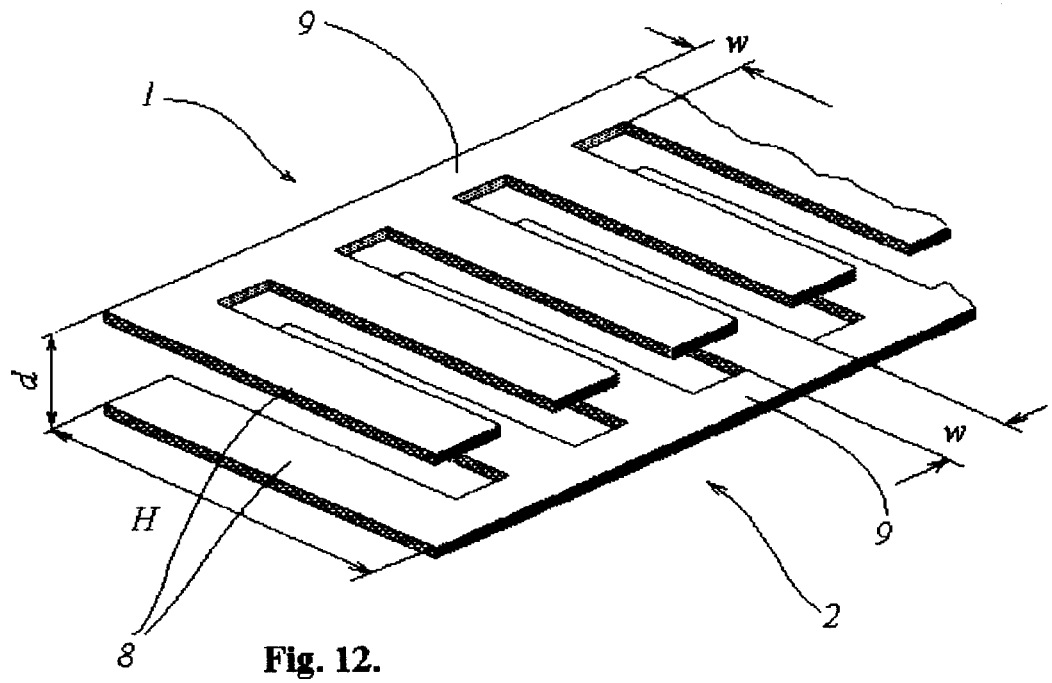
FIG. 12 shows a view of comb impedance conductors according to the present invention.

FIG. 12 shows another preferred embodiment of an electromagnetic delay line according to the present invention. Here, the impedance conductors are shaped as combs with their fingers forming conducting members, 8, and their bases forming conducting elements, 9.

As mentioned above, one preferred embodiment of an electromagnetic delay line according to the present invention comprises impedance conductors in which the patterns are flat spirals with opposite winding directions. The profile of these spirals can be rectangular as shown in FIG. 11, circular as shown in FIG. 7, or other shapes. Due to the opposite winding direction and the opposite direction of currents excited in the spirals facing one another, the azimuth components of the currents in all spirals have the same direction and magnetic fluxes excited by these components add together, increasing the specific inductance $L_0$.

Figure 13:
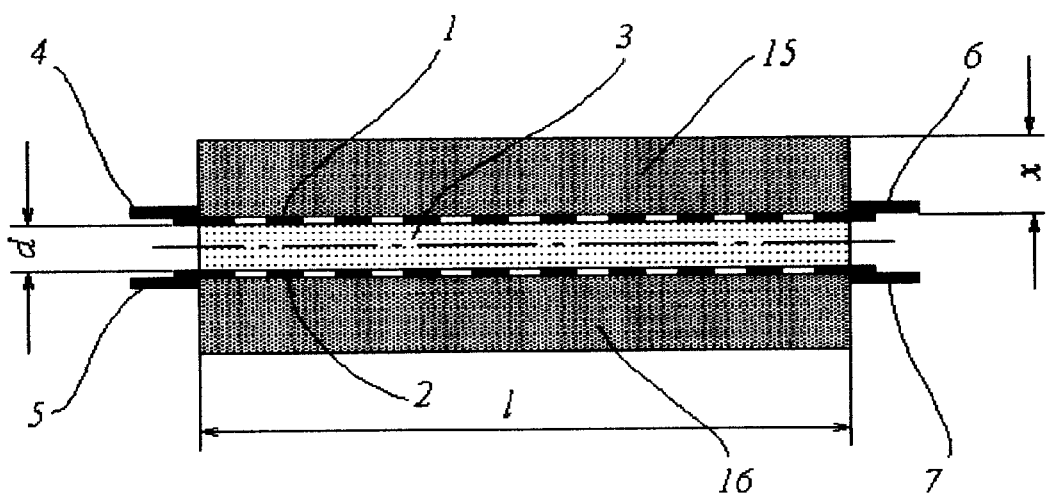
FIG. 13 shows a sectional view of a delay line according to the present invention, with dielectric layers on the outside of the impedance conductors.

In most cases, the outside of impedance conductors 1 and 2 or 1 and 11 should be covered by non-conducting outer bases 15, 16 shown in FIG. 13. This protects the impedance conductors from damage. The influence of the permittivity of such outer bases 15, 16 is much less than the influence of the permittivity of bases 3 and 12 on the delay time.

If the permittivity of outer bases 15, 16 is much greater than the permittivity of base 3, or base 3 and base 12, the additional delay time can be significant. If thickness x of these layers is relatively small, the additional delay time will increase with increasing frequency. This is caused by the dependence of the electric field distribution of the outside impedance conductors upon frequency (see: A. S. Gilmour, Jr., "Principles of Travelling Wave Tubes", p. 329, Artech House, Boston, London). This effect can be used to correct the anomalous dependence of delay time on frequency.

Figure 14:
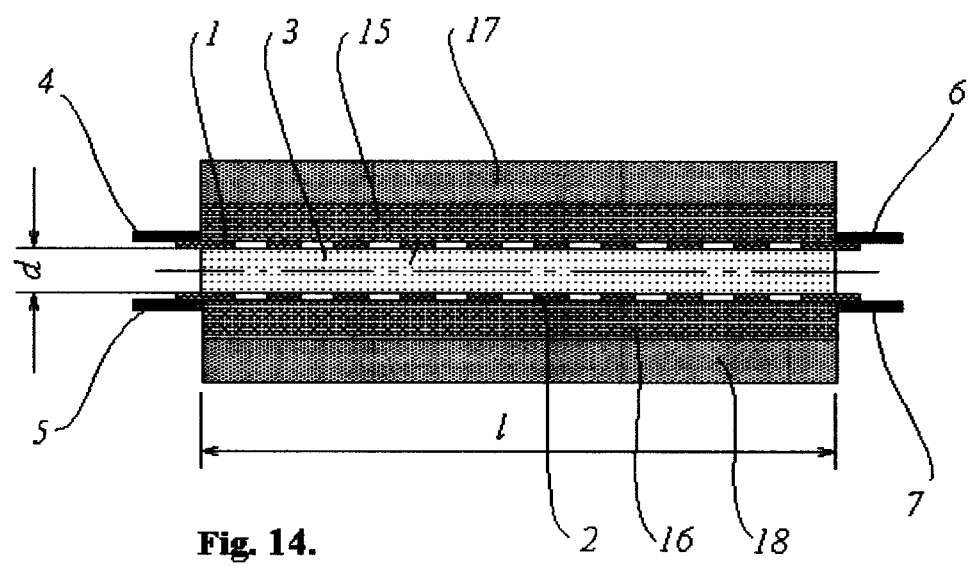
FIG. 14 shows a sectional view of a delay line according to the present invention with non-conducting covers on the outside, made from two layers with different permittivity.

Additional layers (17), (18) of a non-conducting material, placed outside of the outer bases and having a different permittivity (FIG. 14), can be used to control the dependence of the delay time on frequency. If the permittivity of the outer bases 15, 16, adjacent to impedance conductors 1, 2 or 1, 11 is smaller than the permittivity of the additional layers 17, 18; then the decrease in frequency is followed by penetration of the electric field into the additional high permittivity layers, and an increase in the anomalous delay time dependence. Likewise, the anomalous dependence will decrease if the permittivity of outer bases 15, 16, adjacent to impedance conductors 1, 2 or 1, 11 is larger than the permittivity of the additional layers 17, 18.

Making outer bases 15, 16 from magnetic material results in a significant increase of delay time, caused by the increase in magnetic flux.

Figure 15:
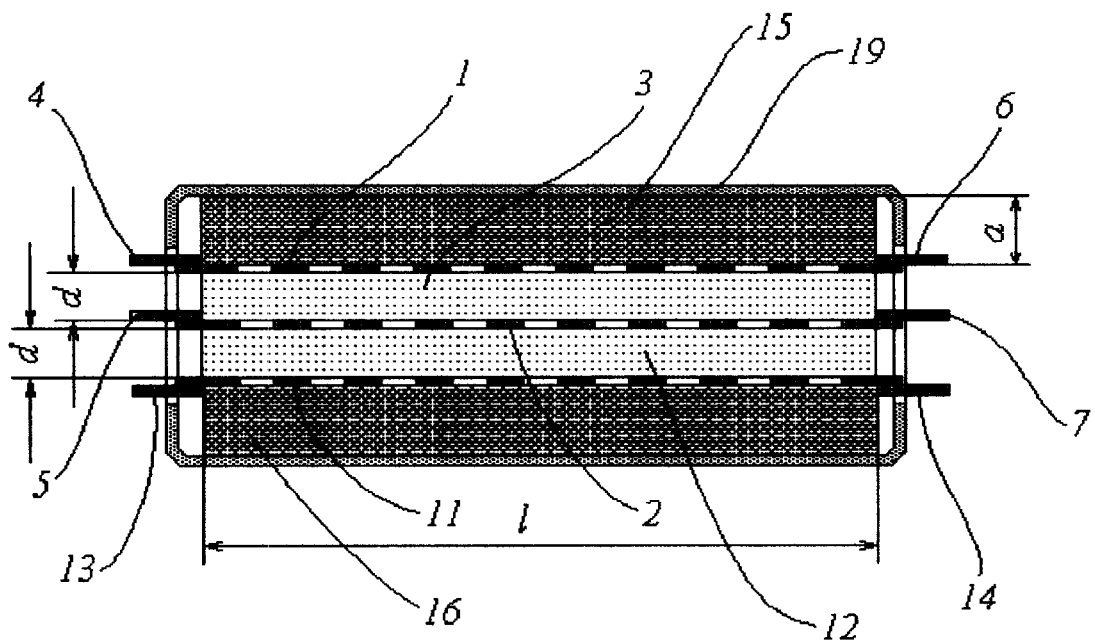
FIG. 15 shows a sectional view of a delay line according to the present invention with a metal shield.

Delay lines according to the present invention can be shielded as shown in FIG. 15. Shield 19 can be connected to additional terminals, or it can be connected to one of the impedance conductors, preferably to a conductor connected to ground. The distance $\alpha$ between shield 19 and impedance conductors 1, 2, for two impedance conductors, or 1, 12 if there are three impedance conductors, should not be much smaller than distance $\Delta$ of the magnetic field concentration near the impedance conductors. This distance depends on the design of the impedance conductors, and can be approximately evaluated as $\lambda/2\pi N$ when considering a flat spiral. In the case of a meander line, this distance is approximately equal to $T/2\pi$.

The most preferred embodiments of the present invention comprise impedance conductors with patterns facing one another configured as mirror images with one turned 180° with respect to the other. In this case, all impedance conductors contribute identically in delay time and electromagnetic losses.

When using impedance conductors which are flat spirals with constant pitch h, the wave impedance $Z_0$ increases approximately proportionally to the cube root of radius r. This allows connecting an electromagnetic source with resistance $R_1$ to the inner terminals of the delay line while connecting its outer terminals to a load with a resistor $R_2$, defined by the relation $$R_2 = \sqrt[3]{r_2/r_1},  \qquad (O)$$

where $r_1$ is the inner radius of the spirals, and $r_2$ is the outer radius of the spirals.

Figure 16:
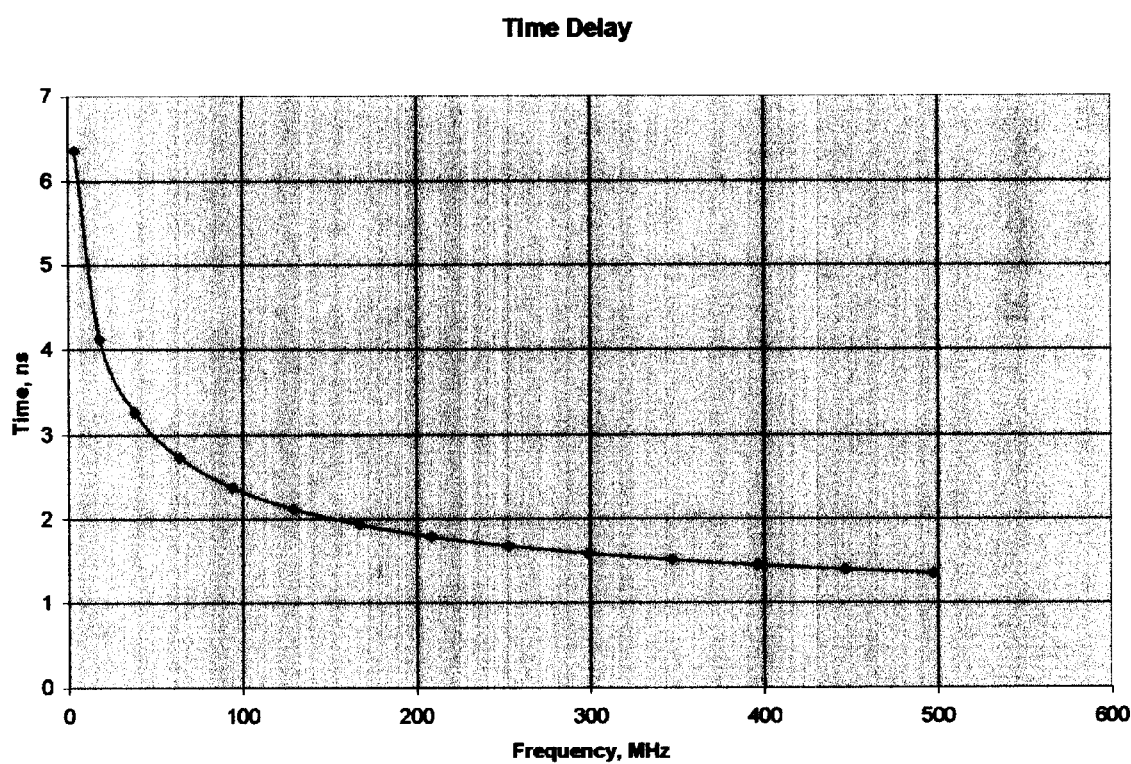
FIG. 16 shows a typical delay time dependence upon frequency, demonstrating anomalous dispersion.

An example of the effectiveness of the present invention is shown in a plot of delay time vs. frequency, obtained by using coupled spirals which were deposited on a 10-mil dielectric plate having a relative permittivity of approximately 3 (FIG. 16).

We claim:

1. An electromagnetic delay line comprising at least one dielectric base, with at least two conductors, electrically insulated from one another, located adjacent to said base, said conductors forming a transmission line with an input and an output, wherein, at least two of said conductors are impedance conductors fashioned as a number of conducting members arranged in series in the direction of signal propagation, said conducting members being positioned at an angle with respect to the direction of signal propagation such that members of at least one impedance conductor are positioned opposite to at least one other impedance conductor.

2. The electromagnetic delay line according to claim 1, wherein, at least one of said impedance conductors is fashioned as a set of conducting members with constant pitch.

3. The electromagnetic delay line according to claim 1, wherein, at least one of said impedance conductors is fashioned as a set of conducting members with constant width.

4. The electromagnetic delay line according to claim 1, wherein, the distance between at least two of said conductors is constant in the direction of signal propagation.

5. The electromagnetic delay line according to claim 1, comprising at least two dielectric bases, wherein three of said conductors are impedance conductors, a middle conductor being placed between two outer conductors and facing them through said bases, the conducting members of said outer conductors being angled in the same direction as each other.

6. The electromagnetic delay line according to claim 1, wherein, said impedance conductors have the configuration of a zigzag line.

7. The electromagnetic delay line according to claim 1, wherein, said impedance conductors have the configuration of a meander line.

8. The electromagnetic delay line according to claim 1, wherein, said impedance conductors have the configuration of a comb.

9. The electromagnetic delay line according to claim 1, wherein, said impedance conductors have the configuration of a spiral.

10. The electromagnetic delay line according to claim 1, wherein, said impedance conductors are installed between outer non-conducting bases.

11. The electromagnetic delay line according to claim 10, wherein, the permittivity of said outer bases exceeds the permittivity of the base (bases) installed between said impedance conductors.

12. The electromagnetic delay line according to claim 10, wherein, said outer bases on the outside of said impedance conductors are two-layer bases made from materials with different permittivity.

13. The electromagnetic delay line according to claim 11, wherein said outer non-conducting bases are made from magnetic material.

14. The electromagnetic delay line according to claim 10, wherein,

At least one of said conductors is a screen conductor with isotropic conductivity, said screen conductor (conductors) being installed outside of said outer non-conducting bases.

15. The electromagnetic delay line according to claim 14, wherein said screen conductor (conductors) is (are) connected to one of the impedance conductors, said connection being made on both ends of said impedance conductor.

16. The electromagnetic delay line according to claim 14, wherein said screen conductor (conductors) is (are) connected to additional input and output terminations, forming together with said impedance conductors a hexapole.

17. The electromagnetic delay line according to claim 14, wherein the distance between said impedance conductors and said screen conductor (conductors) is constant along conductors.

18. The electromagnetic delay line according to claim 1, wherein, the configuration of said impedance conductors is that of mirror images of one another.

19. The electromagnetic delay line according to claim 1, wherein, said input is the set of inner ends of said spirals.

20. The electromagnetic delay line according to claim 1, wherein, said input is the set of outer ends of said spirals.

* * * * *